United States Patent
Oh

(10) Patent No.: US 7,345,948 B2
(45) Date of Patent: Mar. 18, 2008

(54) CLOCK CIRCUIT FOR SEMICONDUCTOR MEMORIES

(75) Inventor: Jong-Hoon Oh, Chapel Hill, NC (US)

(73) Assignee: Infineon Technologies AG, Neubiberg (DE)

( * ) Notice: Subject to any disclaimer, the term of this patent is extended or adjusted under 35 U.S.C. 154(b) by 110 days.

(21) Appl. No.: 11/253,715

(22) Filed: Oct. 20, 2005

(65) Prior Publication Data

US 2007/0091710 A1   Apr. 26, 2007

(51) Int. Cl.
*G11C 8/00* (2006.01)
(52) U.S. Cl. .................... 365/233; 365/194; 365/191
(58) Field of Classification Search ............. 365/233, 365/194, 191, 189.12, 189.02
See application file for complete search history.

(56) References Cited

U.S. PATENT DOCUMENTS

| 6,914,852 B2 * | 7/2005 | Choi .................. 365/233 |
| 7,142,470 B2 * | 11/2006 | Tseng ................. 365/194 |
| 2004/0103226 A1 * | 5/2004 | Johnson et al. ........ 710/52 |

* cited by examiner

*Primary Examiner*—Van Thu Nguyen
*Assistant Examiner*—Dang Nguyen
(74) *Attorney, Agent, or Firm*—Edell, Shapiro & Finnan, LLC

(57) ABSTRACT

A circuit and method for producing a read clock signal in a semiconductor memory device from an input clock signal to ensure that the read access time does not exceed the clock cycle time. One of a plurality of delay amounts is selected to be imposed on the input clock signal depending on the frequency of the clock signal.

25 Claims, 9 Drawing Sheets

(A)

(B)

| MRCK | i+1 | i | tCK RANGE |
|---|---|---|---|
| | 0 | 0 | 5ns OR LONGER (DEFAULT) |
| | 0 | 1 | 4ns |
| | 1 | 0 | 3.5ns |
| | 1 | 1 | 3ns |

| tCK | τDLY | τFIX | tAC |
|---|---|---|---|
| 5ns | 0 | 4ns | 4ns |
| 4ns | 3ns | 4ns | 3ns |
| 3.5ns | 2ns | 4ns | 2.5ns |
| 3ns | 1ns | 4ns | 2ns |

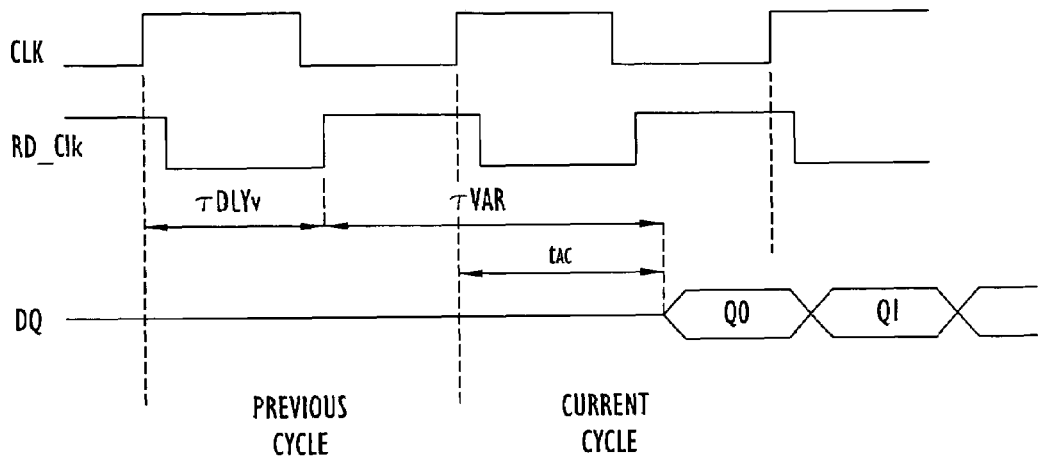
FIG.10
| tCK | TEMP | τDLYv | τVAR | tAC |
|---|---|---|---|---|
| 5ns | HOT | 0 | 4ns | 4ns |
|  | COLD | 0 | 2ns | 2ns |
| 4ns | HOT | 3ns | 4ns | 3ns |
|  | COLD | 4.5ns | 2ns | 2.5ns |
| 3.5ns | HOT | 2ns | 4ns | 2.5ns |
|  | COLD | 3ns | 2ns | 1.5ns |
| 3ns | HOT | 1ns | 4ns | 2ns |
|  | COLD | 2ns | 2ns | 1ns |
FIG.11
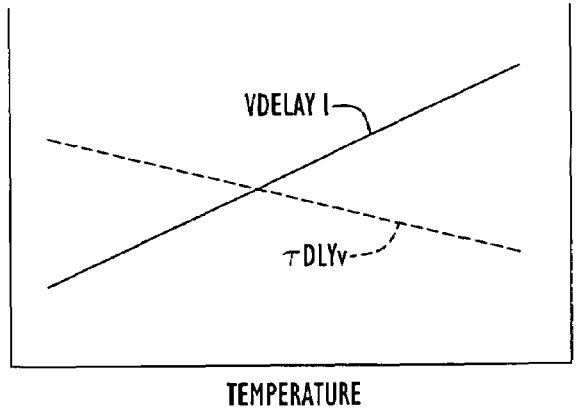
FIG.12

CLOCK CIRCUIT FOR SEMICONDUCTOR MEMORIES

BACKGROUND OF THE INVENTION

The present invention is directed to semiconductor devices, and more particularly to a clock circuit for semiconductor memory devices.

FIG. 1 shows an exemplary memory interface in a low-power synchronous dynamic random access memory (SDRAM) device. A data bus (DQ bus) 10 is interfaced between an LP-DDR memory chip 20 and a controller 30. The controller 30 generates a memory clock (MemCLK) signal that is connected to the CLK input of the memory chip 20. In low-power semiconductor devices, such as low power-single data rate (LP-SDR) or low power-double data rate (LP-DDR) SDRAM devices, the read access to load valid data onto the data bus 10 is triggered by clock edges of the MemCLK signal.

Turning to FIGS. 2(A) and 2(B), there is a read access time ($t_{AC}$) that results from an intrinsic delay path as shown with respect to the main clock signal (CLK). It is very difficult to significantly improve $t_{AC}$. The controller 30 can sample and resynchronize the data stream if $t_{AC}$ is short enough so as to allow for sufficient set-up time. However, as clock signal frequencies become faster with improving semiconductor technologies, the clock cycle time ($t_{CK}$) will become so small that $t_{AC}$ may exceed $t_{CK}$.

By contrast, commodity DDR SDRAMs for applications that are not power sensitive use delay lock loop (DLL) circuits to align data bus (DQ) access to a clock edge. As shown in FIG. 3, DQ switching is aligned to clock edges so that $t_{AC}$ approaches 0 ns, so-called "edge-aligned". Again, this is possible because an on-chip DLL circuit generates early clock cycles that align the data output to clock edges. A DLL circuit may consume a few milliamps (mA) even when the host device is in stand-by mode if the clock is running. A DLL circuit is rarely used in semiconductor devices for low power applications because the DLL power consumption even in a stand-by mode may quickly deplete the battery of the system.

The present invention provides a circuit technique to generate a delayed clock signal to drive read output thereby ensuring that the read access time $t_{AC}$ does not exceed the clock cycle time $t_{CK}$.

SUMMARY OF THE INVENTION

A circuit and method for producing a read clock signal in a semiconductor memory device from an input clock signal to ensure that the read access time does not exceed the clock cycle time. When producing the read clock signal, one of a plurality of delay amounts is selected to be imposed on the input clock signal depending on the frequency of the input clock signal. Thus, compensation can be made for situations when the frequency of the input clock signal is sufficiently high such that, without compensation, the read access time would exceed the clock cycle time.

BRIEF DESCRIPTION OF THE DRAWINGS

FIG. 10 is a diagram of clock, read clock and data bus signals whose timing is achieved by the embodiment shown in FIG. 9.

FIG. 11 is a table listing exemplary time durations for portions of the signals shown in FIG. 10.

FIG. 12 is a diagram showing plots for relationships of time delay versus temperature associated with the embodiment of FIG. 9.

DETAILED DESCRIPTION

Figure 1:
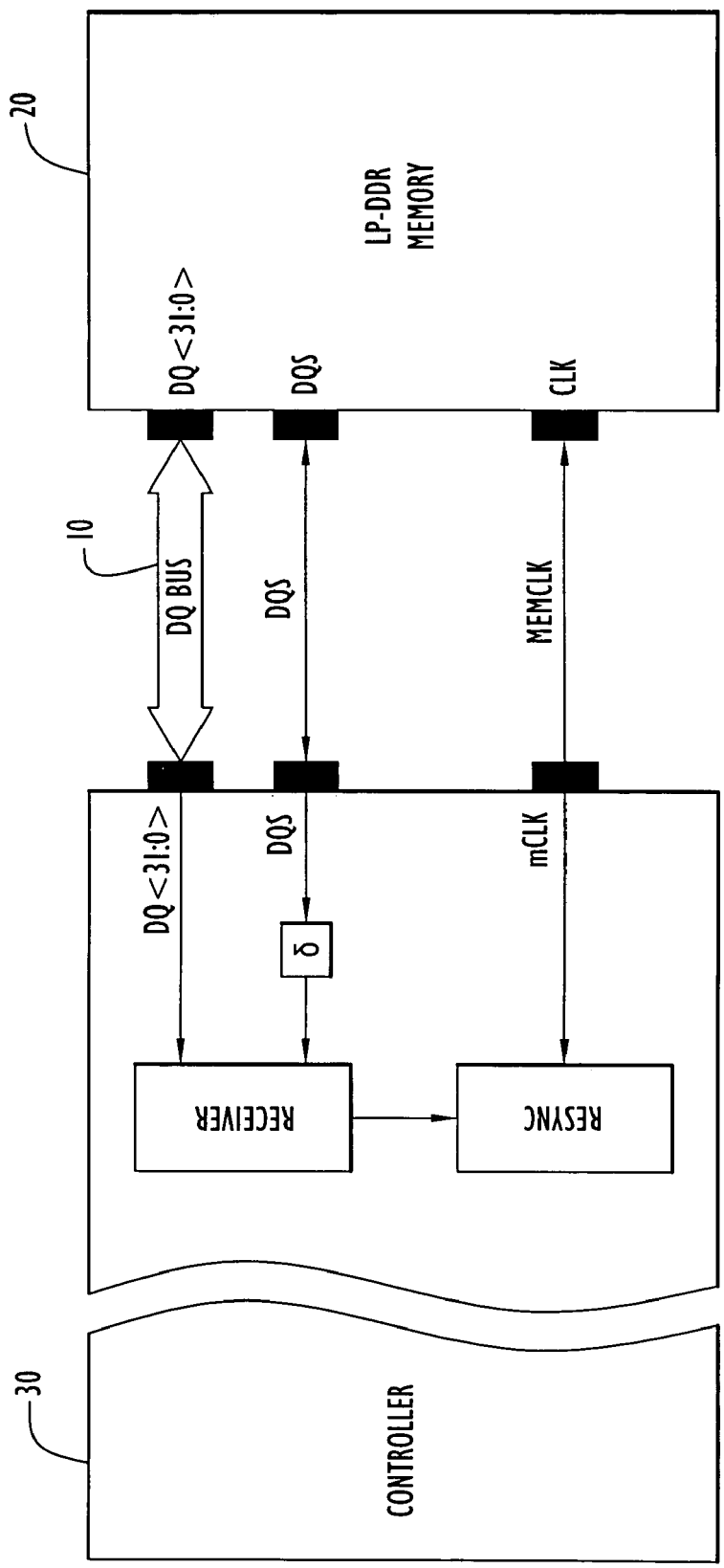
FIG. 1 is a block diagram of a prior art memory interface for a low power computing application.
Figure 2:
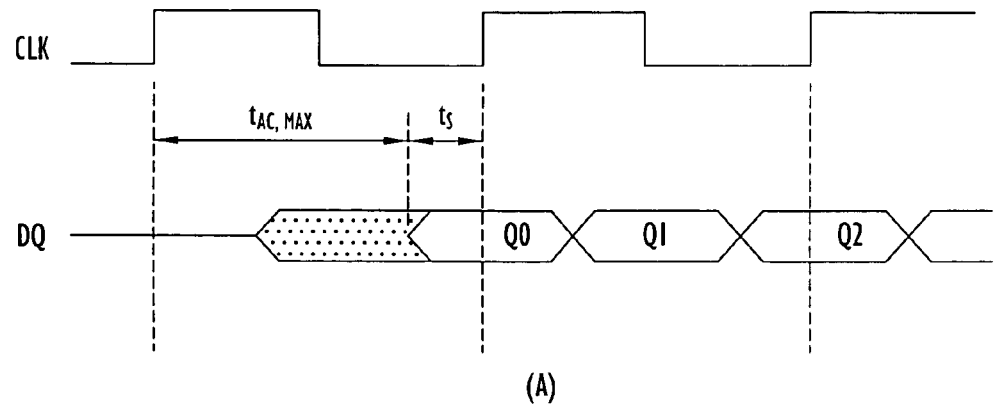
FIGS. 2(A) and 2(B) are timing diagrams associated with clock and data bus signals in the prior art memory interface shown in FIG. 1.
Figure 2:
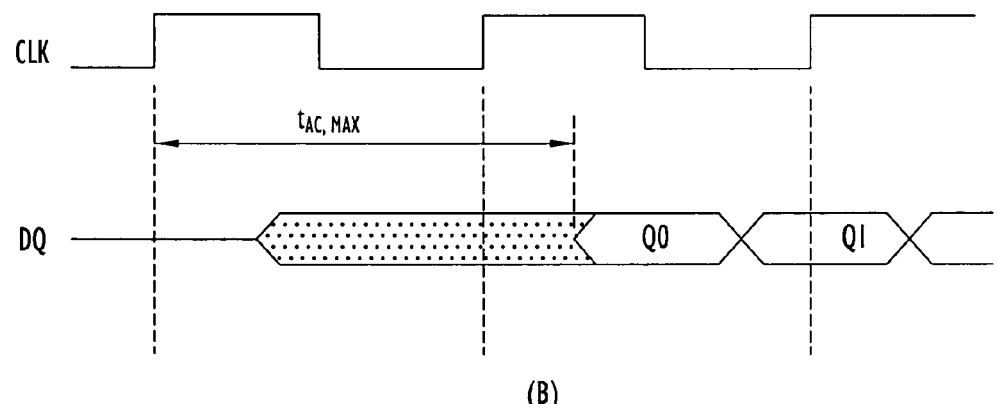
Figure 3:
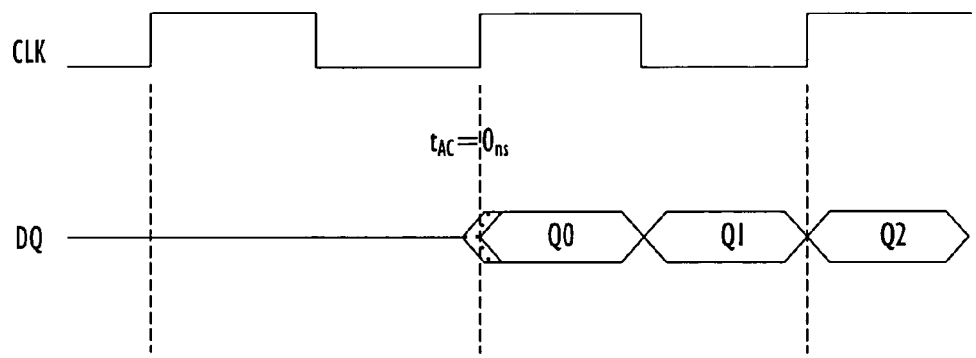
FIG. 3 is a timing diagram showing edge alignment of clock and data bus signals achievable in non-mobile computing applications with a delay lock loop (DLL).
Figure 4:
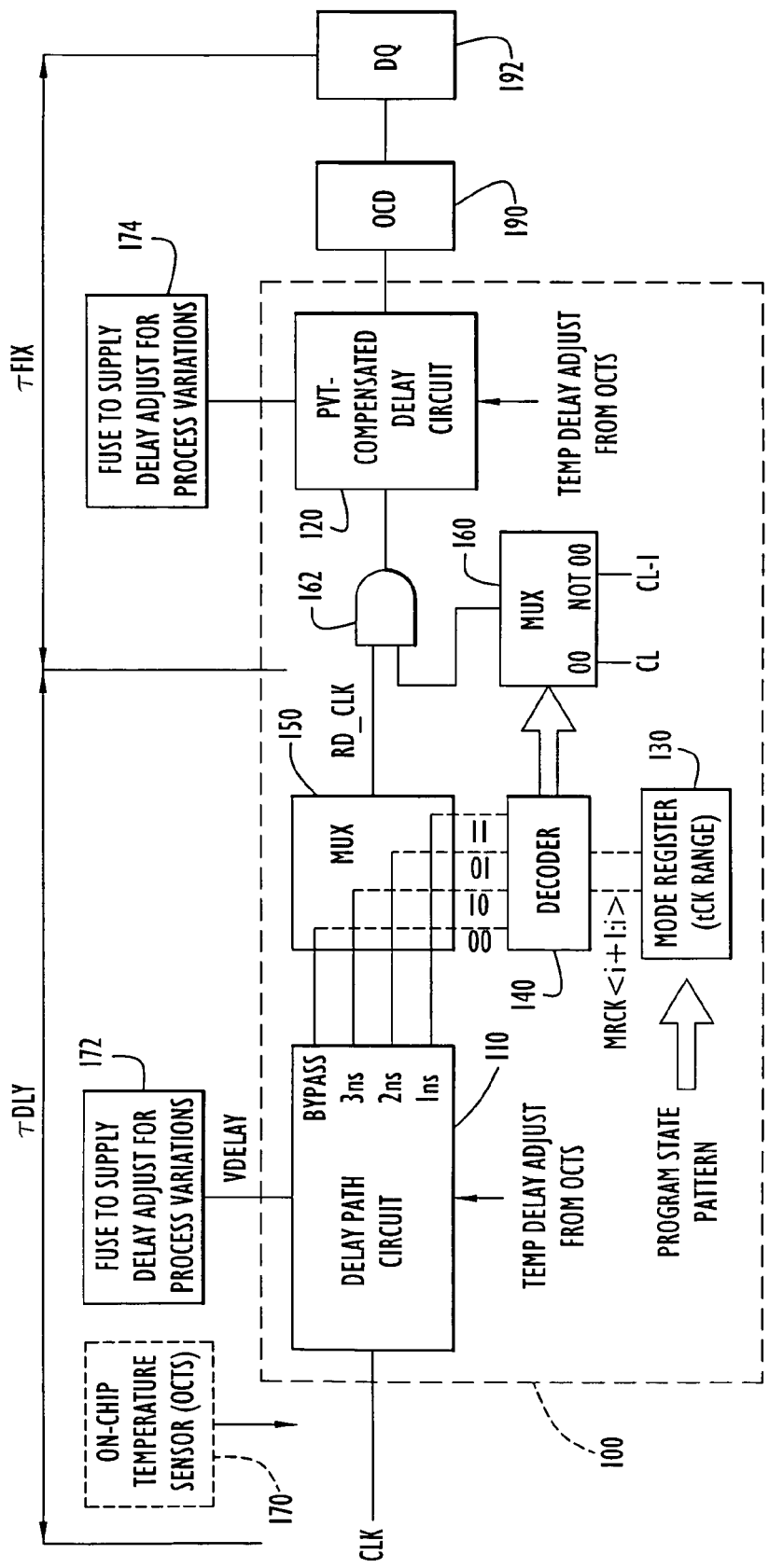
FIG. 4 is a block diagram of one embodiment of the present invention.

Referring to FIG. 4, a control circuit is shown at reference numeral 100. The control circuit 100 is arranged to receive as input the so-called main clock signal (CLK) supplied by a controller chip (FIG. 1) and to produce a read clock signal (RD_Clk) that is a delayed version of CLK by an amount (zero or non-zero) depending on the amount of delay needed to ensure that read access time $t_{AC}$ does not exceed the time duration of one cycle of CLK (e.g., CLK period), $t_{CK}$. Thus, even as clock frequencies increase with improved semiconductor technologies, the rising edge of the incoming clock signal can be delayed so that $t_{AC}$ is maintained short enough not to exceed $t_{CK}$. As is known to those with ordinary skill in the art, the read clock signal is generated when there is a read access command to the memory device.

The control circuit 100 comprises a delay path circuit 110 (a first delay circuit) that delays CLK by each of a plurality of delay amounts to produce a plurality of delayed signals. Each delayed signal is produced by delaying CLK by a corresponding different (zero or non-zero) amount. For example, as shown in FIG. 4, one delay amount is zero and is therefore called the bypass signal output, one has a 3 ns delay, one has a 2 ns delay and one has a 1 ns delay. In addition, the control circuit 100 comprises a PVT-compensated delay circuit 120 (a second delay circuit) that imposes an intrinsic delay path $\tau_{FIX}$ designed to produce constant or substantially constant delay over voltage, temperature and process (PVT) variation. A mode register 130 stores values that determine the needed delay to CLK to produce, RD_Clk.

A decoder 140 is connected to the mode register 130, to a multiplexer (MUX) 150 and to a MUX 160. Inputs of the decoder 140 are connected to the mode register 130 to determine which of the plurality of delayed signals output by the delay path circuit 110 the MUX 150 selects for output to the MUX 160. The RD_Clk signal is coupled to the PVT-compensated delay block 120 via an AND gate 162 that is gated by the output of the MUX 160. The MUX 160 operates as a latency gate where if the programmed state of the register 130 is the default state 00, then the internal delay path ($\tau_{DLY}$) gets bypassed and a latency value (CL) is used to drive the data output, thus initiating the delay from the rising edge of the CLK signal at the current cycle to produce the RD_Clk signal. On the other hand, if the programmed state of the register is any value other than the default state 00, then one less latency (CL−1) is used to initiate delay from the rising edge of CLK signal at the previous clock cycle to produce the RD_Clk signal.

An on-chip temperature sensor (OCTS) 170 detects the temperature of the memory device and generates a temperature adjust signal to the delay path circuits 110 and 120 to adjust for temperature variations of the device. In addition, there is a fuse 172 associated with delay circuit 110 and a fuse 174 associated with delay circuit 120. These fuses can be used to trim the delay amounts (by $V_{delay}$) of these circuits for process variations.

Figures 5, 6, 7:
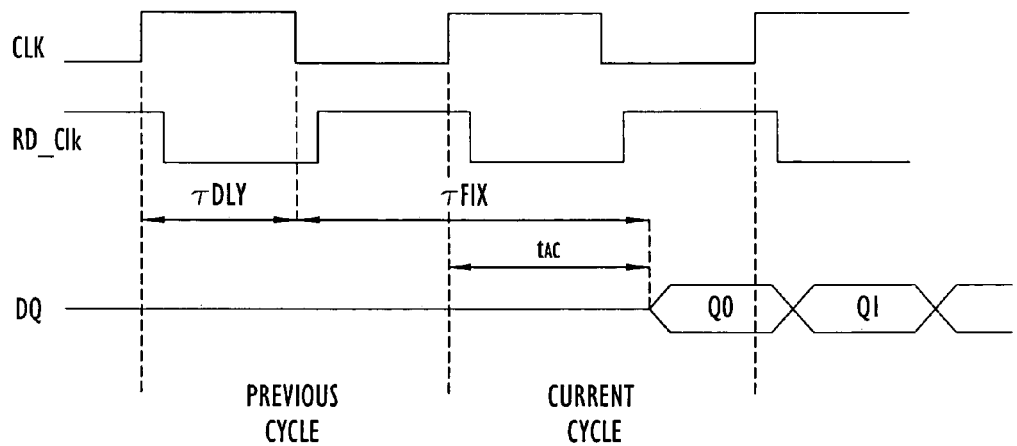
FIG. 5 shows exemplary state assignments for a mode controller register according to the present invention.
FIG. 6 is a diagram of clock, read clock and data bus signals whose timing is achieved by the embodiment shown in FIG. 4.
FIG. 7 is a table listing exemplary time durations for portions of the signals shown in FIG. 6.

The controller 30 (FIG. 1) programs the mode register 130 according to the value of $t_{CK}$, i.e., the frequency of the CLK signal. As shown in FIG. 5, the register 130 is programmed with a bit pattern that represents one of a plurality of states. A state of the register 130 is assigned to a corresponding frequency of the CLK signal. For example, the bit pattern or state "00", corresponding to a default value, is written to the register 130 when $t_{CK}$ is sufficiently long (e.g., 5 ns or longer) such that no delay compensation is needed because the frequency of the CLK signal is relatively low. When $t_{CK}$ is shorter (the clock frequency is higher), adjustments are made by increments depending on the time duration of $t_{CK}$. For example, state "01" of the register 130 corresponds to a $t_{CK}$ of 4 ns, state "10" corresponds to a $t_{CK}$ of 3.5 ns and state "11" corresponds to a $t_{CK}$ of 3 ns. The delay applied to the CLK signal by delay path circuit 110 is selectable by the programmed state of the mode register 130 to select the delay to the CLK signal needed to generate RD_Clk. The RD_Clk signal is output from the circuit 100 to an off-chip driver 190 that in turn uses the signal in connection with reading data from the DQ bus for output on a DQ 192.

Turning to FIGS. 6 and 7, the control circuit 100 will be described in further detail in connection with exemplary values for $t_{AC}$ and $t_{CK}$. In the example shown in FIGS. 6 and 7, the intrinsic delay path is 4 ns and is constant regardless of $t_{CK}$, voltage and temperature. Process variations can be accounted for by testing the delay during or after manufacture and trimming by fuse selection if necessary.

The underlying principle with respect to the delay compensation is represented by the expression:

$$t_{AC} = \tau_{DLY} + \tau_{FIX} - t_{CK}.$$

Case 1: When $t_{CK}$ is 5 ns, then the selected internal delay $\tau_{DLY}$ is 0, such that $t_{AC}$ is 4 ns (which is less than $t_{CK}$ of 5 ns).

Case 2: When $t_{CK}$ is 4 ns, then the selected internal delay $\tau_{DLY}$ is 3 ns, such that $t_{AC}$ is 3 ns (which is less than $t_{CK}$ of 4 ns).

Case 3: When $t_{CK}$ is 3.5 ns, then $\tau_{DLY}$ is 2 ns such that $t_{AC}$ is 2.5 ns, (which is less than $t_{CK}$ of 3.5 ns).

Case 4: When $t_{CK}$ is 3 ns, then $\tau_{DLY}$ is 1 ns, such that $t_{AC}$ is 2 ns (which is less than $t_{of}$ 3 ns).

As indicated in FIG. 6, in Case 1, the clock edge for the current clock cycle is used for the starting point of the imposed delay. In Cases 2-4, the rising clock edge from the previous clock cycle is used to start the delay compensation.

According to the table shown in FIG. 7, a value for $\tau_{DLY}$ is chosen to make the result of ($\tau_{DLY} + \tau_{FIX} - t_{CK}$) exceed $t_{CK}$ but not to exceed $2t_{CK}$.

Figure 8:
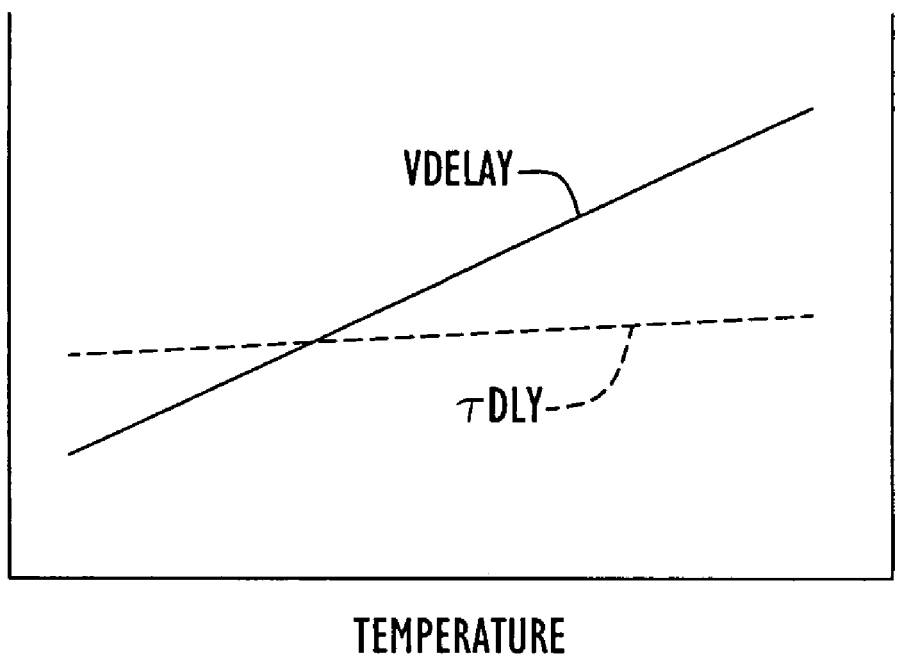
FIG. 8 is a diagram showing plots for relationships of time delay versus temperature associated with the embodiment of FIG. 4.

FIG. 8 illustrates the relationship between Vdelay and temperature, the relationship between $\tau_{DLY}$ and temperature. As shown in this figure, Vdelay increases with increasing temperature, whereas $\tau_{DLY}$ is relatively constant with increasing temperature.

Figure 9:
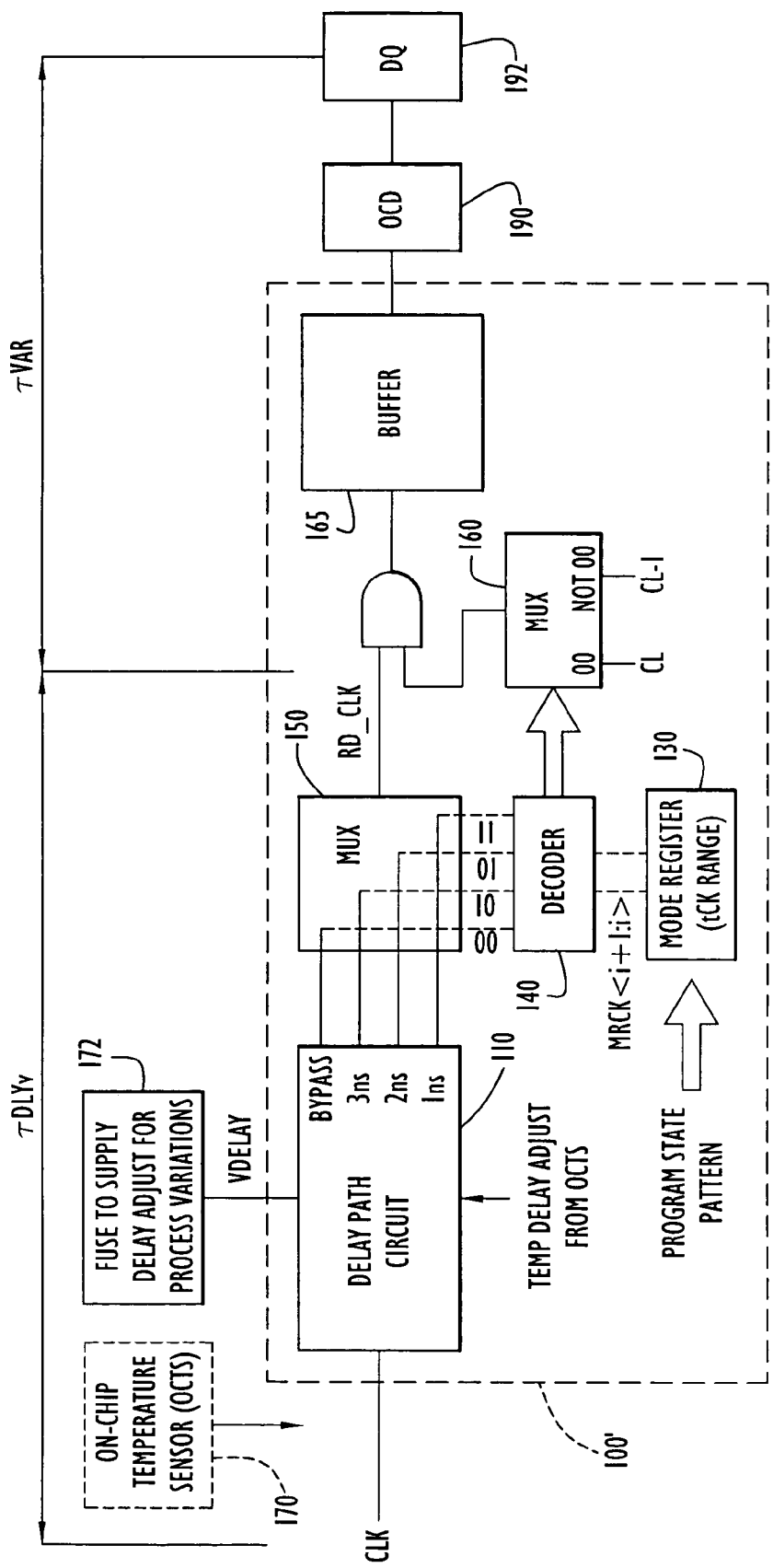
FIG. 9 is a block diagram of another embodiment of the present invention.

FIG. 9 illustrates another embodiment of the present invention that is a variation of the embodiment shown in FIG. 4. This embodiment involves only a single controlled delay path, the delay path circuit 110, that produces the variable internal delay $\tau_{DLW}$. The delay path circuit 110 is adjusted over PVT in order to compensate for timing variations in the intrinsic delay path $\tau_{VAR}$. The delay path circuit 110 is trimmable for process variations ($V_{delay1}$) by fuse 172, whereas the intrinsic delay path $\tau_{VAR}$ is not trimmed for PVT variations. The delay path circuit 110 can perform more aggressive delay adjustment over process, voltage and temperature so that it compensates for timing variations in the intrinsic delay path $\tau_{VAR}$.

Like the control circuit shown in FIG. 4, the control circuit 100' comprises a delay path circuit 110, a mode register 130, decoder 140, MUX 150, MUX 160 and AND gate 162. In addition, the control circuit 100' comprises a buffer 165 that allows the signal to obtain enough strength to drive the subsequent stage of circuits, and makes the voltage level of the signal usable in the subsequent circuits. The intrinsic delay path $\tau_{VAR}$ is not controlled, but is the duration of the time delay it imposes on the RD_Clk signal, determined through testing and experimentation so that the appropriate amount of variable delay can be imposed by delay circuit 110 to account for different frequencies of the CLK signal.

Turning to FIGS. 10-12 with continued reference to FIG. 9, a controller programs the mode register 130 in order to select the appropriate values for $\tau_{DLW}$ to adjust the resulting $t_{AC}$. For example, in the table shown in FIG. 11, for each value of $t_{CK}$, there is a corresponding pair of values for both $\tau_{DLW}$ and $\tau_{VAR}$, one of the values in the pair being selected depending on whether the temperature of the memory device is relatively "hot" or relatively "cold". A "hot" condition may be a temperature above a threshold, and a "cold" condition may be a temperature below a threshold. For example, when $t_{CK}$ is 5 ns (a relatively slow clock frequency), $\tau_{DLW}$ is 0 regardless of the temperature conditions of the memory chip. Through tests and measurements made during or after manufacture, it may be determined, for example, that $\tau_{VAR}$ is 4 ns for hot conditions and 2 ns for cold conditions. The corresponding $t_{AC}$ is 4 ns for when the memory chip is hot and 2 ns when the memory chip is cold, and in either case $t_{AC}$ is less than $t_{CK}$ without the need to impose any further delay by the delay path circuit 110. The values for $\tau_{DLW}$ and $\tau_{VAR}$ for the other $t_{CK}$ cases are shown in the table in FIG. 11. The controller 30 programs the mode register 130 of clock frequency as in FIG. 5). The delay circuit 110 determines the appropriate one of the hot or cold values for $\tau_{DLW}$ by virtue of information supplied by the OCTS 170. $V_{delay1}$ is used to tune the delay imposed by delay circuit 110 to account for temperature and process variations. As shown in FIG. 12, $V_{delay1}$ increases with increasing temperature, while $\tau_{DLW}$ decreases with increasing temperature.

The advantage of the embodiment shown in FIG. 9 is that there is only one circuit or block that requires trimming to account for process variations. Consequently, the embodiment shown in FIG. 4 requires two fuses for trimming, whereas the embodiment shown in FIG. 9 requires only a single fuse.

Figure 13:
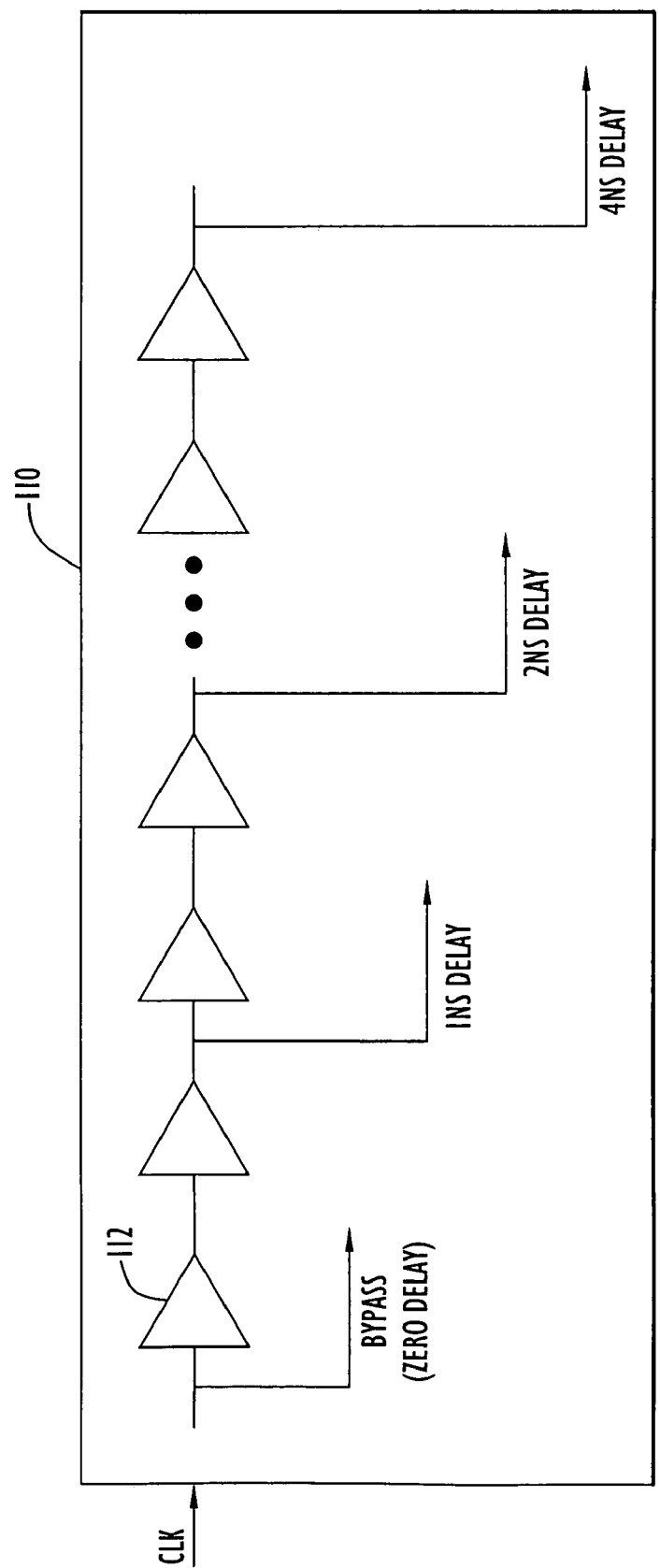
FIG. 13 is a diagram of a delay circuit useful in the embodiments of the present invention.

With reference to FIG. 13, in the embodiments described herein, the delay path circuits 110 and 120 may be implemented by a chain of gate inverters. For example, the delay path circuit 110 may comprise a chain of inverters 112, where points in the chain are tapped for output depending on the amount of delay desired and the desired gradation between delayed output signals. Alternatively, the delay path circuits may be implemented by resistor-capacitor (R-C) delay circuits, where the resistance and/or capacitance can be selected to adjust the amount of delay the circuit produces.

Figure 14:
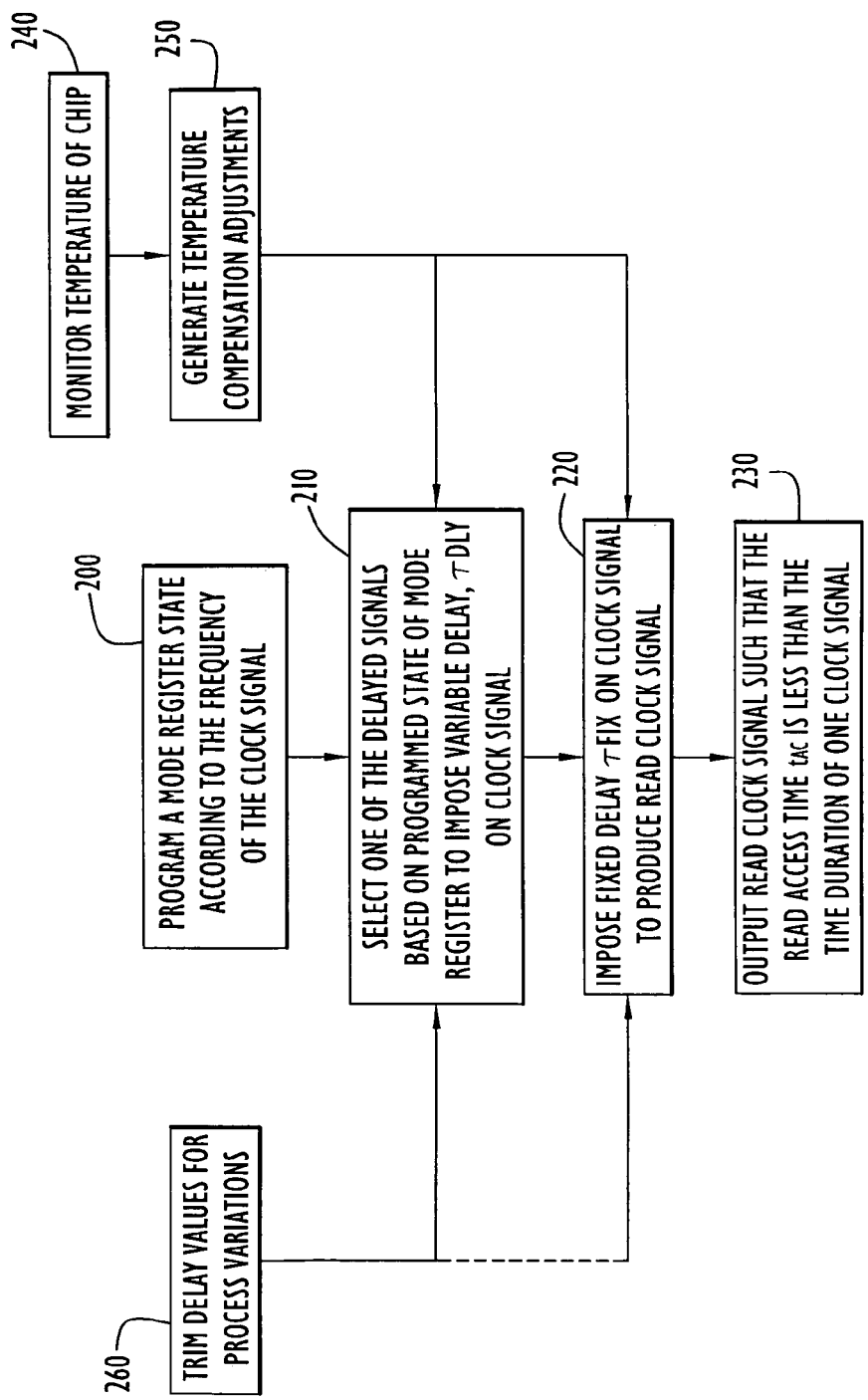
FIG. 14 is a flow chart depicting methods according to the embodiments of FIGS. 4 and 9.

FIG. 14 illustrates a flow chart that depicts the operations performed in the embodiments described above. Reference is also made to FIGS. 4 and 9. Step 200 represents programming of the mode register with a bit pattern depending on the frequency (and thus, the value of $t_{CK}$) of the clock signal being supplied to the memory device. Next, in step 210, the decoder 140, based on the programmed state of the mode register 130, supplies a select signal to the MUX 150 in order to select the corresponding one of the plurality of delayed clock signals produced by the delay path circuit 110. Next, in step 220, a fixed delay is imposed on the clock signal by the PVT-compensated delay circuit 120 to produce the read clock signal. In the case of the embodiment on FIG. 9, the fixed delay is not adjusted for process conditions, but rather results from the intrinsic delay of the circuitry. In step 230, the read clock signal is then output to the OCD for use in reading data from the data bus. The temperature conditions of the memory chip may be monitored by the on-chip sensor 170 in step 240 to generate temperature compensation adjustments in step 250 that are applied to the variable delay and the fixed delay applied to the clock signal in steps 210 and 220, respectively. In addition, based on testing performed during and/or after manufacture of the semiconductor memory device, in step 260, values for trimming the delay amounts imposed in steps 210 (and 220) may be applied using fuse option techniques to adjust for process variations.

The benefits of the circuit and method described herein are numerous. The circuitry needed to implement these techniques is rather simple, and therefore requires little area on a chip. In addition, unlike a DLL, the circuitry consumes a minimal amount of power. Therefore, it is a solution that can be readily deployed in low power semiconductor devices. In addition, these techniques can adjust for increases in the frequency of the clock signal produced in the host device become as improvements are made in semiconductor fabrication and computing system technologies.

The system and methods described herein may be embodied in other specific forms without departing from the spirit or essential characteristics thereof. The foregoing embodiments are therefore to be considered in all respects illustrative and not meant to be limiting.

What is claimed is:

1. A method for producing a read clock signal in a memory device from a clock signal supplied to the memory device, the method comprising:
    delaying the clock signal by a delay amount depending on a frequency of the clock signal so as to ensure that a read access time is less than a time duration of one cycle of the clock signal;
    adjusting the delay amount based on a monitored temperature of the memory device and process and voltage conditions of the memory device; and
    programming the memory device with data that selects the delay amount from a plurality of possible delay amounts based on the frequency of the clock signal;
    wherein delaying comprises delaying the clock signal by the delay amount that comprises a first portion and a second portion, wherein the first portion is a selectable value between zero and a non-zero value depending on the frequency of the clock signal and the second portion is a value that is independent of the frequency of the clock signal and which is substantially constant over variations in process, voltage and temperature conditions of the memory device.

2. The method of claim 1, wherein when the frequency of the clock signal is relatively low such that the time duration of one cycle of the clock signal is greater than the second portion of the delay amount, said first portion of the delay amount is selected to be zero, and said delaying comprises delaying the clock signal by the delay amount with respect to an edge at a current cycle of the clock signal.

3. The method of claim 1, wherein when the frequency of the clock signal is such that the time duration of one cycle of the clock signal is less than the second portion of the delay amount, said first portion of the delay amount is selected to be a non-zero value, and delaying comprises delaying the clock signal by the delay amount with respect to an edge at a previous cycle of the clock signal.

4. The method of claim 1, and further comprising monitoring the temperature of the memory device; and selecting a value for the first portion of the delay amount that is further based on the temperature of the memory device.

5. The method of claim 1, and further comprising trimming the first portion of the delay amount to account for process variations of the device.

6. The method of claim 5, wherein trimming comprises burning a fuse associated on the memory device.

7. A circuit for producing a read clock signal in a memory device from a clock signal supplied to the memory device, the circuit comprising:
    a. a first delay circuit that is configured to receive as input the clock signal and is configured to generate a plurality of outputs that comprise the clock signal delayed by a corresponding zero or non-zero delay amount, wherein the first delay circuit is responsive to signals to adjust the delay amount based on a monitored temperature of the memory device and process and voltage conditions of the memory device; and
    b. a multiplexer that is configured to select one of the plurality of outputs of the first delay circuit depending on a frequency of the clock signal to produce the read clock signal such that a read access time is less than a time duration of one cycle of the clock signal.

8. The circuit of claim 7, and further comprising a register that is configured to store a bit pattern representing one of a plurality of states, each state assigned to a corresponding frequency of the clock signal, wherein a state of the register is programmable with a value that corresponds to the frequency of the clock signal; and a decoder connected to the register that is configured to output a select signal to the multiplexer to select one of the plurality of outputs based on the state of the register.

9. The circuit of claim 8, and further comprising a second delay circuit coupled to an output of the multiplexer, wherein the second delay circuit is configured to delay the signal output of the multiplexer by a further delay amount that is independent of the frequency of the clock signal and is substantially constant over variations in process, voltage and temperature conditions of the memory device.

10. The circuit of claim 9, wherein the register is programmable with a value that corresponds to a frequency of the clock signal such that the time duration of one cycle of the clock signal is greater than the further delay amount produced by the second path circuit, and wherein the decoder is configured to select one of the plurality of outputs of the multiplexer that corresponds the clock signal delayed by zero delay amount.

11. The circuit of claim 9, wherein the register is programmable to a value that corresponds to a frequency of the clock signal that is relatively high such that the time duration of one cycle of the clock signal is less than the further delay amount produced by the second path circuit, and wherein the decoder is configured to select one of the plurality of outputs of the multiplexer that corresponds the clock signal delayed by a non-zero delay amount.

12. A circuit for producing a read clock signal in a memory device from a clock signal supplied to the memory device, the circuit comprising:
  a. first delaying means for delaying the clock signal by a plurality of delay amounts to produce a plurality of delayed signals, wherein the first delaying means is responsive to signals to adjust the delay amounts based on a monitored temperature of the memory device and process and voltage conditions of the memory device; and
  b. multiplexing means coupled to the first delaying means for selecting one of the plurality delayed signals depending on a frequency of the clock signal to produce the read clock signal such that a read access time is less than a time duration of one cycle of the clock signal.

13. The circuit of claim 12, and further comprising second delaying means coupled to an output of the multiplexing means, wherein the second delaying means is configured to delay the signal output of the multiplexing means by a further delay amount that is independent of the frequency of the clock signal and is substantially constant over variations in process, voltage and temperature conditions of the memory device.

14. The circuit of claim 12, and further comprising means for storing a bit pattern representing one of a plurality of states, each state assigned to a corresponding frequency of the clock signal; and decoding means connected to the means for storing for outputting a select signal to the multiplexing means to select one of the plurality of outputs of the first delaying means based on the state of the register.

15. The circuit of claim 12, and further comprising trimming means for adjusting the delay produced by the first delaying means to account for process variations.

16. A memory device, comprising:
  a. a clock input that is configured to receive a clock signal;
  b. a data bus that is configured to have data retrieved from memory cells in the memory device placed thereon;
  c. a circuit for producing a read clock signal from the clock signal, the circuit comprising:
    i. a first delay circuit that is configured to receive as input the clock signal and is configured to generate a plurality of outputs that comprise the clock signal delayed by a corresponding zero or non-zero delay amount, wherein the first delay circuit is responsive to signals to adjust an amount of delay based on a monitored temperature of the memory device and process and voltage conditions of the memory device; and
    ii. a multiplexer that is configured to selecting one of the plurality of outputs of the first delay circuit depending on a frequency of the clock signal to produce the read clock signal such that a read access time is less than a time duration of one cycle of the clock signal.

17. The memory device of claim 16, and further comprising a register that is configured to store a bit pattern representing one of a plurality of states, each state assigned to a corresponding frequency of the clock signal, wherein a state of the register is programmable with a value that corresponds to the frequency of the clock signal; and a decoder connected to the register that is configured to output a select signal to the multiplexer to select one of the plurality of outputs based on the state of the register.

18. The memory device of claim 17, and further comprising a second delay circuit coupled to an output of the multiplexer, wherein the second delay circuit is configured to delay the signal output of the multiplexer by a further delay amount that is independent of the frequency of the clock signal and is substantially constant over variations in process, voltage and temperature conditions of the memory device.

19. The memory device of claim 18, wherein the register is programmable with a value that corresponds to a frequency of the clock signal that is relatively low such that the time duration of one cycle of the clock signal is greater than the further delay amount produced by the second path circuit, and wherein the decoder is configured to select one of the plurality of outputs of the multiplexer that corresponds the clock signal delayed by zero delay amount.

20. The memory device of claim 18, wherein the register is programmable with a value that corresponds to a frequency of the clock signal that is relatively high such that the time duration of one cycle of the clock signal is less than the further delay amount produced by the second path circuit, and wherein the decoder is configured to select one of the plurality of outputs of the multiplexer that corresponds the clock signal delayed by a non-zero delay amount.

21. The memory device of claim 7, and further comprising an on-chip temperature sensor that is configured to sense temperature of the memory device and that is configured to generate a temperature signal, wherein the on-chip temperature sensor is coupled to the first delay circuit.

22. The memory device of claim 12, and further comprising means for sensing temperature of the memory device and generating a temperature signal that is coupled to the first delaying means.

23. The memory device of claim 16, and further comprising an on-chip temperature sensor that is configured to sense temperature of the memory device and that is configured to generate a temperature signal, wherein the on-chip temperature sensor is coupled to said circuit that produces a read clock signal.

24. A method for producing a read clock signal in a memory device from a clock signal supplied to the memory device, the method comprising delaying the clock signal by a delay amount depending on a frequency of the clock signal so as to ensure that a read access time is less than a time duration of one cycle of the clock signal, wherein delaying comprises delaying the clock signal by the delay amount that comprises a first portion and a second portion, wherein the first portion is a selectable value between zero and a non-zero value depending on the frequency of the clock signal, and wherein when the frequency of the clock signal is such that the time duration of one cycle of the clock signal may become less than the read access time, said first portion of the delay amount is selected to be a non-zero value, and wherein said delaying comprises delaying the clock signal by the delay amount with respect to an edge at a previous cycle of the clock signal.

25. A circuit for producing a read clock signal in a memory device from a clock signal supplied to the memory device, the circuit comprising:
  a. a first delay circuit that is configured to receive as input the clock signal and is configured to generate a plurality of outputs that comprise the clock signal delayed by a corresponding zero or non-zero delay amount; and
  b. a multiplexer that is configured to select one of the plurality of outputs of the first delay circuit depending on a frequency of the clock signal to produce the read clock signal such that a read access time is less than a time duration of one cycle of the clock signal,
wherein the circuit for producing a read clock signal is further configured to delay the clock signal by a non-zero delay amount with respect to an edge at a previous cycle of the clock signal when the frequency of the clock signal is such that the time duration of one cycle of the clock signal may become less than the read access time.

* * * * *